(12) United States Patent
Fujiwara et al.

(10) Patent No.: US 11,037,644 B2
(45) Date of Patent: Jun. 15, 2021

(54) TESTING CIRCUIT, TESTING METHOD, AND APPARATUS FOR TESTING MULTI-PORT RANDOM ACCESS MEMORY

(71) Applicant: Taiwan Semiconductor Manufacturing Co., Ltd., Hsinchu (TW)

(72) Inventors: Hidehiro Fujiwara, Hsin-Chu (TW); Yen-Huei Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/561,055

(22) Filed: Sep. 5, 2019

(65) Prior Publication Data

US 2020/0105358 A1  Apr. 2, 2020

Related U.S. Application Data

(60) Provisional application No. 62/737,890, filed on Sep. 27, 2018.

(51) Int. Cl.
| | | |
|---|---|---|
| *G11C 29/00* | (2006.01) | |
| *G11C 29/02* | (2006.01) | |
| *G06F 11/27* | (2006.01) | |
| *G11C 11/41* | (2006.01) | |
| *G11C 8/16* | (2006.01) | |
| *G11C 29/50* | (2006.01) | |

(52) U.S. Cl.
CPC ............ *G11C 29/025* (2013.01); *G06F 11/27* (2013.01); *G11C 8/16* (2013.01); *G11C 11/41* (2013.01); *G11C 29/50* (2013.01)

(58) Field of Classification Search
CPC ....... G11C 29/025; G11C 29/50; G11C 11/41; G11C 8/16; G06F 11/27
See application file for complete search history.

(56) References Cited

U.S. PATENT DOCUMENTS

| | | | | |
|---|---|---|---|---|
| 6,288,969 | B1 * | 9/2001 | Gibbins | ................... G11C 8/16 365/154 |
| 2007/0070743 | A1 * | 3/2007 | Do | ......................... G11C 29/26 365/201 |
| 2009/0244999 | A1 * | 10/2009 | Aitken | ................... G11C 29/14 365/201 |

* cited by examiner

*Primary Examiner* — Samir W Rizk
(74) *Attorney, Agent, or Firm* — JCIPRNET (57) ABSTRACT

A testing circuit for testing a multi-port random access memory includes an input circuit, a first port testing circuit and a second port testing circuit. The input circuit receives a testing clock signal and a test mode enable signal and is configured to provide the testing clock signal according to the test mode enable signal. The first port testing circuit is coupled to the input circuit, and is configured to output a first word line enable signal for a first port of the multi-port random access memory according to the testing clock signal and a first delay signal. The second port testing circuit is coupled to the input circuit, and is configured to output a second word line enable signal for a second port of the multi-port random access memory according to the testing clock signal and a second delay signal. The first word line enable signal and the second word line enable signal are asserted at the same time, and the first word line enable signal is de-asserted before the second word line enable signal. A method adapted for a testing circuit and an apparatus including a device under test and a testing circuit are also introduced.

20 Claims, 5 Drawing Sheets

TESTING CIRCUIT, TESTING METHOD, AND APPARATUS FOR TESTING MULTI-PORT RANDOM ACCESS MEMORY

CROSS-REFERENCE TO RELATED APPLICATION

This application claims the priority benefit of U.S. provisional application Ser. No. 62/737,890, filed on Sep. 27, 2018. The entirety of the above-mentioned patent application is hereby incorporated by reference herein and made a part of this specification.

BACKGROUND

Testing process is an essential process to guarantee quality of electronic circuits. In a multi-port random access memory (RAM), a read operation on a first port of the multi-port RAM may disturb a write operation on a second port of the multi-port RAM. Especially, when the multi-port RAM is operating in a read-first mode (read and then write mode), the worst case write is very severe because a write period in the victim port of the multi-port RAM may be fully covered by a read period in the aggressor port of the multi-port RAM.

In addition, since the write margin depend on clock skew and it is time consuming to control the clock skew for testing, the testing time would be long if clock skew is controlled to assure the worst case for testing.

Therefore, it is desirable to emulate a worst case of write operation in the read-first mode of the multi-port RAM without considering the clock skew, thereby reducing the test time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
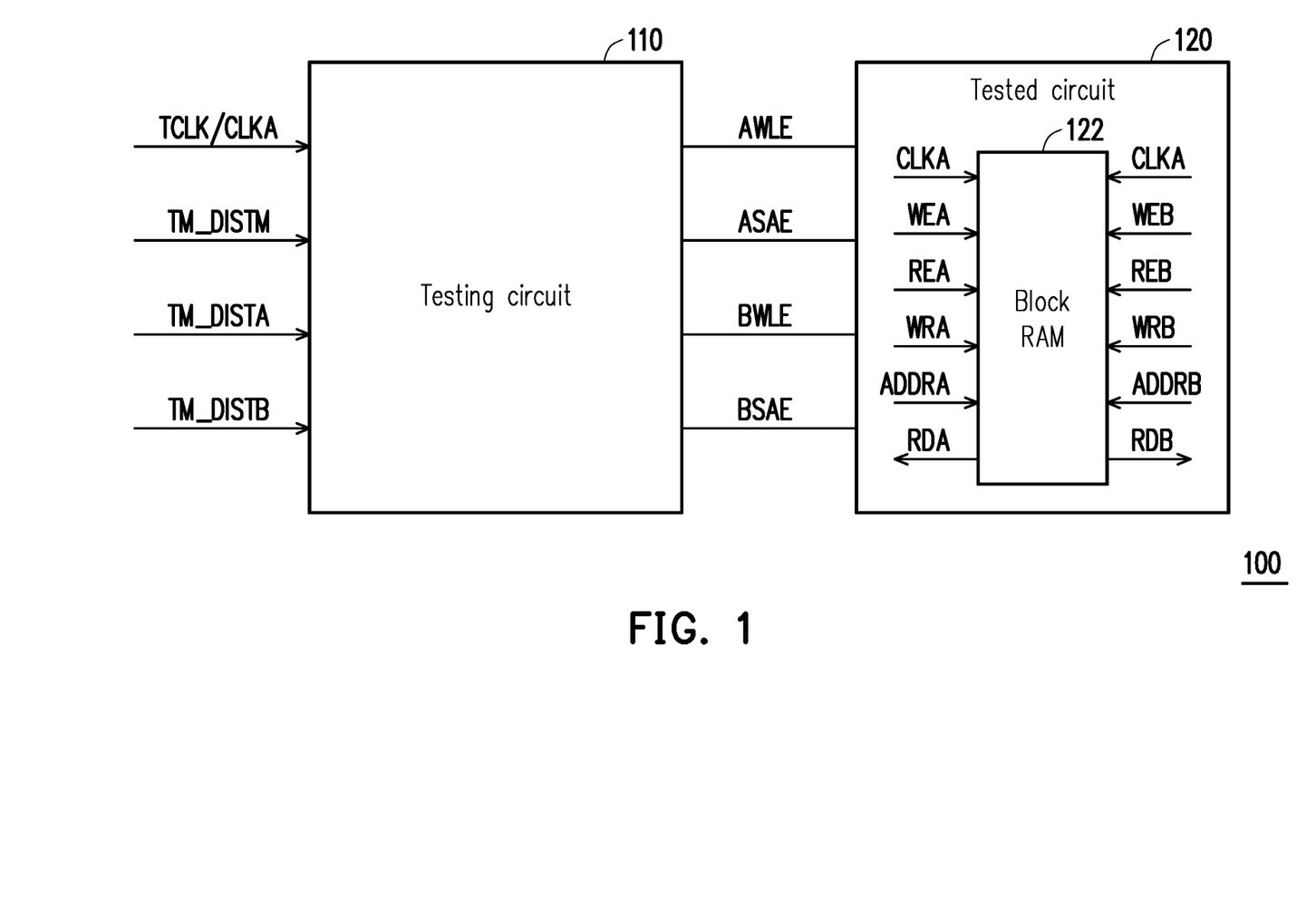
FIG. 1 illustrates a schematic diagram of an apparatus including a testing circuit and a tested circuit according to an embodiment of the present disclosure.

Referring to FIG. 1, an apparatus 100 includes a testing circuit 110 and a tested circuit 120 (also referred to as a device under test). The tested circuit 120 may include a multi-port RAM 122 or block RAM which supports different operation modes such as a read-first mode, a write with write-back mode, and a write without write-back mode. A write operation to a memory cell in the read-first mode starts by reading the value stored in the memory cell, and then writing a new value to the memory cell.

In an embodiment of the present disclosure, the block RAM 122 may be dual-port static random access memory (SRAM) that have two read-write ports (e.g., port A and port B). Port A of the block RAM 122 may include a number of pins for a clock signal CLKA, a read enable signal REA, a write enable signal WEA, an address signals ADDRA, write data WRA, and read data RDA. Similarly, port B of the block RAM 122 may include pins for a clock signal CLKB, a read enable signal REB, a write enable signal WEB, an address signals ADDRB, write data WRB, and read data RDB. The block RAM 122 may support two independent operations in two ports. For example, port A may be configured to perform a write operation while port B is configured to perform a write operation in the read-first mode. In another example, port A may be configured to perform the write operation in the read-first mode while port B is configured to perform the read operation. When two ports of the block RAM 122 are configured for two independent operations (read and write operations), the read operation may disturb the write operation, especially when the read operation and the writ operation are directed to the same memory cells (or the same memory addresses).

The testing circuit 110 is configured to test different operations of the tested circuit 120. In an embodiment of the present disclosure, the testing circuit 110 may emulate the worst case of the write operation in the read-first mode of the multi-port RAM 122 to test the tested circuit 120. For example, in a worst case of the write operation in the read-first mode of the block RAM 122, the write period in the victim port (the port configured for the write operation) is fully covered by the read and dummy read period in the aggressor port (the port configured for the read operation). As such, there is no pure write period of the write operation in the victim port. Meanwhile, the read operation in the aggressor port and the write operation in the victim port may be performed on the same memory cells.

The testing circuit 110 may receive a clock signal TCLK/ CLKA, a test mode enable signal TM_DISTM, a first delay signal TM_DISTA and a second delay signal TM_DISTB.

The testing circuit 110 may provide word line enable signals AWLE, BWLE, and sense amplifier enable signals ASAE and BSAE to the tested circuit 120 to perform a testing operation.

Figure 2:
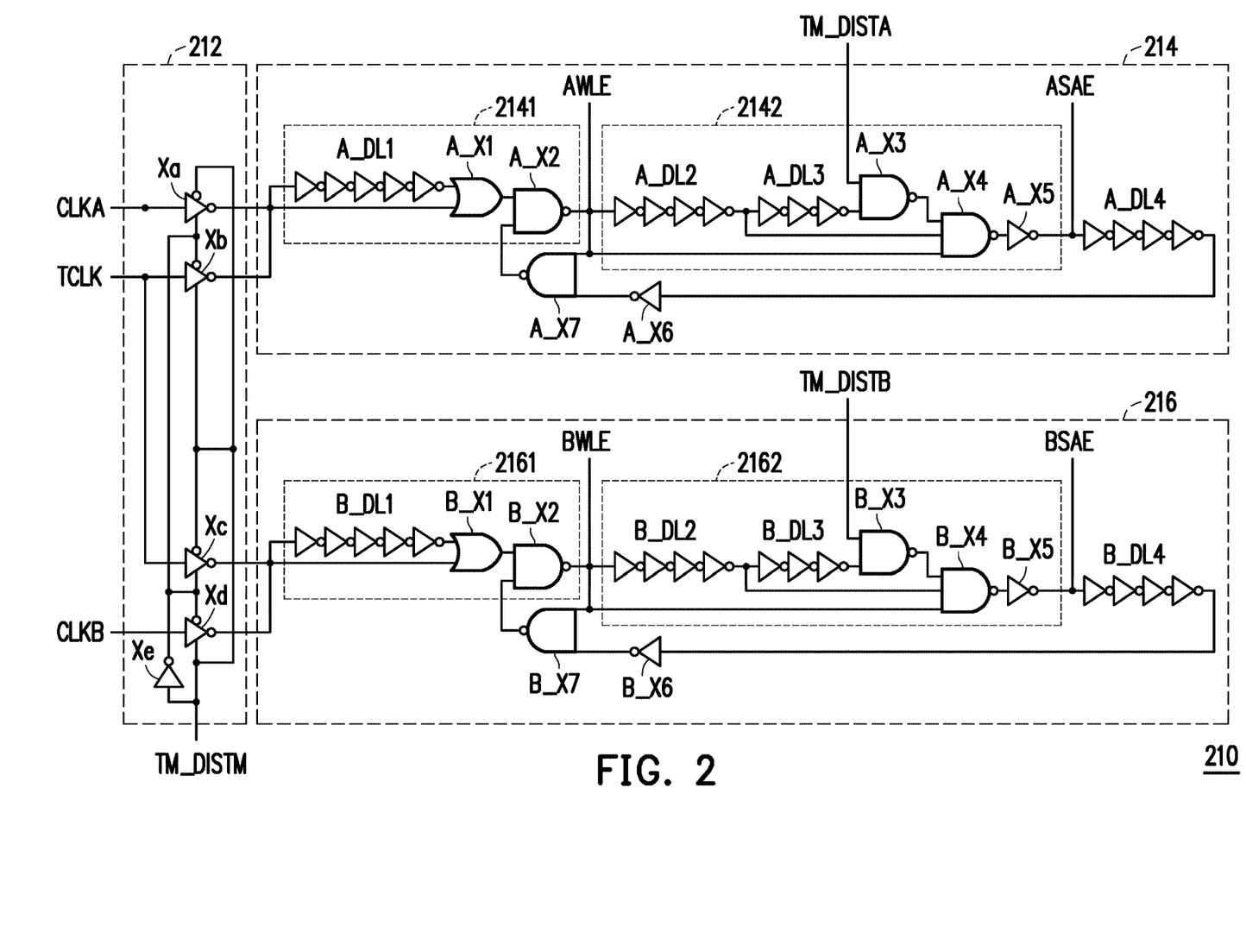
FIG. 2 illustrates a schematic diagram of a testing circuit according to an embodiment of the present disclosure.

Referring to FIG. 2, a testing circuit 210 includes an input circuit 212, a first port testing circuit 214, a second port testing circuit 216, a delay line A_DL4, an inverter A_X6 and a NAND A_X7. The input circuit 212 receives a testing clock signals TCLK, CLKA, LCKB and a test mode enable signal TM_DISTM. The input circuit 212 is configured to provide the testing clock signal TCLK to the first port testing circuit 214 and the second testing circuit 216 in a test mode; and the input circuit 212 is configured to provide the clock signals CLKA and CLKB to the first and second testing circuits 214, 216, respectively in a normal mode.

The input circuit 212 may include a plurality of logic circuits Xa to Xd which receive the test mode enable signal TM_DISTM and an inverted signal of the test mode enable signal TM_DISTM. The inverted signal of the test mode enable signal TM_DISTM is generated by an inverter Xe. In the normal mode, the test mode enable signal TM_DISTM is in the low logic level (e.g., logic "0"), the logic circuits Xa to Xd of the input circuit 212 are controlled to output the clock signals CLKA and CLKB to the first port testing circuit 214 and the second port testing circuit 216, respectively. In the test mode, the test mode enable signal TM_DISTM is in the high logic level (e.g., logic "1") and the logic circuits Xa to Xd of the input circuit 212 are controlled to output the testing clock signal TCLK to both of the first port testing circuit 214 and the second port testing circuit 216. In an embodiment of the present disclosure, the logic circuits Xa to Xd may be the controlled inverters, but the disclosure is not limited thereto.

The first port testing circuit 214 includes a word line enable circuit 2141, a delay circuit 2142, delay line elements A_DL4, an inverter A_X6 and an NAND A_X7. The word line enable circuit 2141 receives the clock signal TCLK from the input circuit 212 and outputs the word line enable signal AWLE for the first port (port A) of the block RAM in the test mode. The delay circuit 2142 is coupled to the word line enable circuit 2141, and is configured to delay a de-assertion of the word line enable signal AWLE for a pre-determined period according to a delay signal TM_DISTA. When the delay signal TM_DISTA is in the high logic level, the de-assertion of the word line enable signal AWLE is delayed for the pre-determined period. When the delay signal TM_DISTA is in the low logic level, the de-assertion of the word line enable signal AWLE is not delayed for the pre-determined period. A sense amplifier enable signal ASEN is output at the output terminal of the delay circuit 2142.

The word line enable circuit 2141 may include delay line elements A_DL1, an OR gate A_X1 and a NAND gate A_X2. In the test mode, the OR gate A_X1 receives the clock signal TCLK and a delayed signal of the clock signal TCLK by the delay line elements A_DL1 as input signals. The OR gate A_X1 is configured to perform an OR operation on the received input signals. The NAND gate A_X2 receives the output of the OR gate A_X1 and an output of the NAND gate A_X7 as input signals, and is configured to perform a NAND operation to output the word line enable signal AWLE.

The delay circuit 2142 includes delay line elements A_DL2, A_DL3, NAND gates A_X3, A_X4 and an inverter A_X5. The delay line elements A_DL2 and A_DL3 are configured to delay the word line enable signal AWLE. The output of the delay line elements A_DL2, A_DL3 is coupled to one input terminal of the NAND gate A_X3, and another input terminal of the NAND gate A_X3 receives the delay signal TM_DISTA. When the delay signal TM_DISTA is in the high logic level (e.g. logic "1"), the NAND gate A_X3 outputs the word line enable signal AWLE being delayed by the delay line elements A_DL2 and A_DL3 to an input terminal of the NAND A_X4. Other input terminals of the NAND A_X4 are coupled to a connection node between the delay line elements A_DL2 and the delay line elements A_DL3, and the output terminal of the word line enable circuit 2141. The output terminal of the NAND A_X4 is coupled to the inverter A_X5, and the output terminal of the inverter A_X5 outputs a sense amplifier enable signal ASAE.

The output of the delay circuit 2142 is coupled to delay line elements A_DL4. The delay line element A_DL4 are coupled to the inverter A_X6, and the output of the inverter A_X6 is coupled to an input terminal of the NAND A_X7. Another input terminal of the NAND A_X7 receives the word line enable signal AWLE. The output of the NAND A_X7 is coupled to an input terminal of the NAND A_X2.

Similar to the first port testing circuit 214, the second port testing circuit 216 includes a word line enable circuit 2161, a delay circuit 2162, delay line elements B_DL4, an inverter B_X6 and a NAND B_X7. The word line enable circuit 2161 receives the clock signal TCLK from the input circuit 212 and outputs a word line enable signal BWLE for the second port (port B) of the block RAM in the test mode. The delay circuit 2162 is coupled to the word line enable circuit 2161, and is configured to delay a de-assertion of the word line enable signal BWLE for a pre-determined period according to a delay signal TM_DISTB. A sense amplifier enable signal BSEN is output at the output of the delay circuit 2162.

The word line enable circuit 2161 may include delay line elements B_DL1, an OR gate B_X1 and a NAND gate B_X2. In the test mode, the OR gate B_X1 receives the clock signal TCLK and a delayed signal of the clock signal TCLK by the delay line elements B_DL1 as input signals. The OR gate B_X1 is configured to perform an OR operation on the received input signals. The NAND gate B_X2 receives the output of the OR gate B_X1 and an output of the NAND gate B_X7 as input signals, and is configured to perform a NAND operation to output the word line enable signal BWLE.

The delay circuit 2162 includes delay line elements B_DL2, B_DL3, NAND gates B_X3, B_X4 and an inverter B_X5. The delay line elements B_DL2 and B_DL3 are configured to delay the word line enable signal BWLE. The output of the delay line elements B_DL2, B_DL3 is coupled to one input terminal of the NAND gate B_X3, and another input terminal of the NAND gate B_X3 receives the delay signal TM_DISTB. When the delay signal TM_DISTB is in the high logic level (e.g. logic "1"), the NAND gate B_X3 outputs the word line enable signal BWLE being delayed by the delay line elements B_DL2 and B_DL3 to an input terminal of the NAND B_X4. Other input terminals of the NAND B_X4 are coupled to a connection node between the delay line elements B_DL2 and the delay line elements B_DL3, and the output terminal of the word line enable circuit 2161. The output terminal of the NAND B_X5 is coupled to the inverter B_X5, and the output terminal of the inverter B_X5 outputs a sense amplifier enable signal BSAE.

The output of the delay circuit 2162 is coupled to delay line elements B_DL4. The delay line element B_DL4 are coupled to the inverter B_X6, and the output of the inverter B_X6 is coupled to an input terminal of the NAND B_X7. Another input terminal of the NAND B_X7 receives the word line enable signal BWLE. The output of the NAND B_X7 is coupled to an input terminal of the NAND B_X2.

Table 1 shows the truth table indicating the operating mode of the block RAM and the of the signals TM_DISTM, TM_DISTA and TM_DISTB. When the signal TM_DISTM is in the low logic level (logic "0"), the block RAM operates in the normal mode. When the signal TM_DISTM is in the high logic level (logic "1") and the signal TM_DISTA and TM_DISTB are in different logic levels, the block RAM enters the test mode (or read-during-write RDW mode). When the signal TM_DISTM is in the high logic level (logic "1") and the signal TM_DISTA and TM_DISTB are in the same logic level, the block RAM is in an illegal mode.

In the test mode, when the signal TM_DISTA is in the high logic level and the signal TM_DISTB is in the low logic level, the first port (port A) is the aggressor port and the second port (port B) is the victim port. It should be noted that the victim port is configured for the write operation in the read-first mode, and the aggressor port is configured for the read operation. When the signal TM_DISTA is in the low logic level and the signal TM_DISTB is in the high logic level, the first port (port A) is the victim port and the second port (port B) is the aggressor port.

Table 1:

TABLE 1

| TM_DISTM | TM_DISTA | TM_DISTB | Description |
|---|---|---|---|
| 0 | x | x | Normal mode |
| 1 | 1 | 0 | RDW test mode Port A: Aggressor Port B: Victim |
| 1 | 0 | 1 | RDW test mode Port A: Victim Port B: Aggressor |
| 1 | 0 | 0 | Illegal mode |
| 1 | 1 | 1 | Illegal mode |

Figure 3:
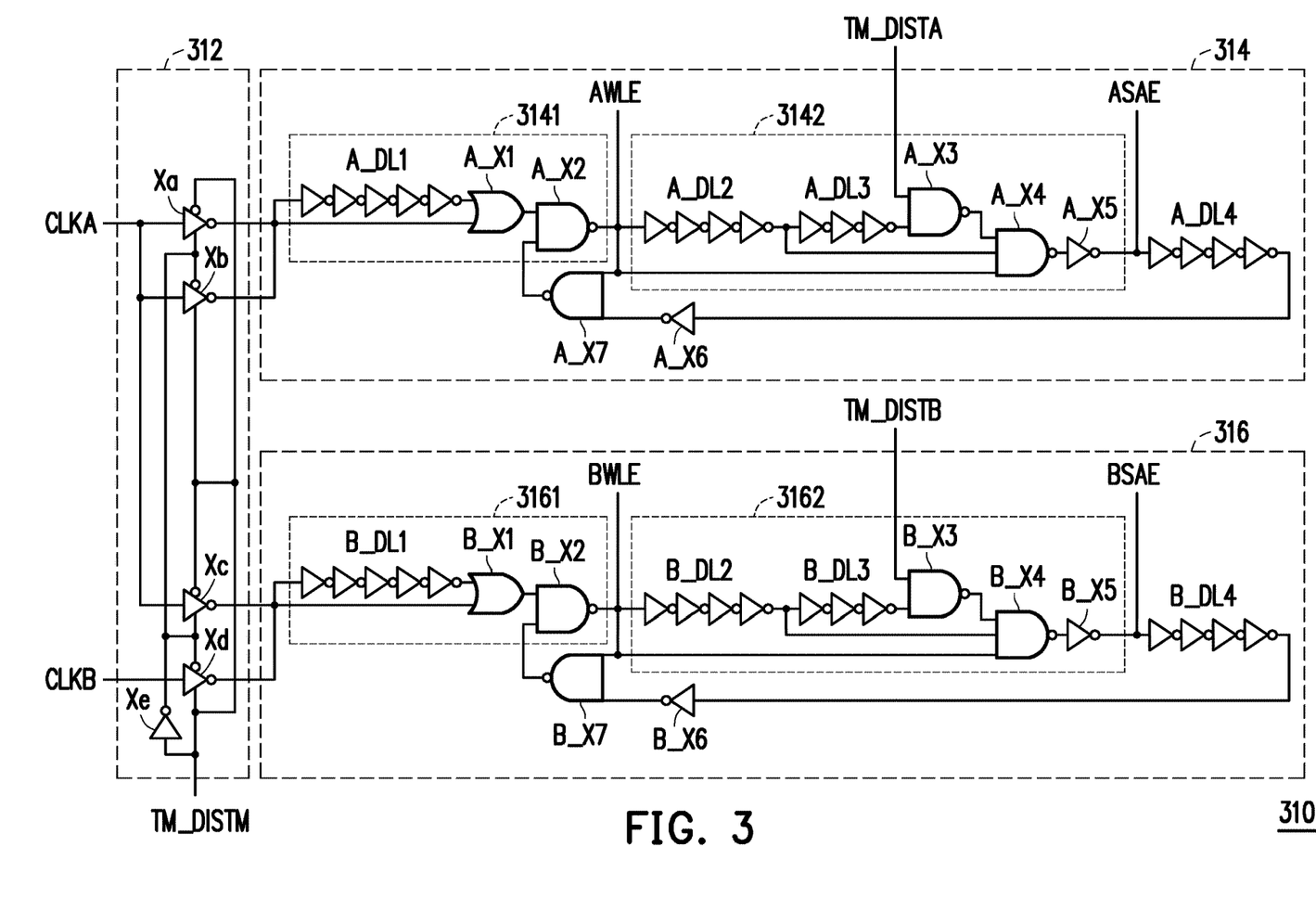
FIG. 3 illustrates a schematic diagram of a testing circuit according to another embodiment of the present disclosure.

Referring to FIG. 3, a testing circuit 310 includes an input circuit 312, a first port testing circuit 314 and a second port testing circuit 316. The first port testing circuit 314 and the second port testing circuit 316 are similar to the first port testing circuit 214 and the second port testing circuit 216 of the testing circuit 210 shown in FIG. 2, thus the detailed description of the first and second port testing circuits 314, 316 are omitted hereafter.

A difference between the testing circuit 310 as shown in FIG. 3 and the testing circuit 210 as shown in FIG. 2 is the input circuit. The input circuit 212 in FIG. 2 has a dedicated pin for receiving the testing clock signal TCLK in the test mode. On the other hand, the input circuit 312 in FIG. 3 uses one of the clock signals CLKA or CLKB as the testing clock signal. In an embodiment of the present disclosure, the clock signal CLKA is used for both of the first and second port testing circuits 314 and 316 in the test mode. In this way, a pin number of the input circuit 313 may be reduced.

Figure 4:
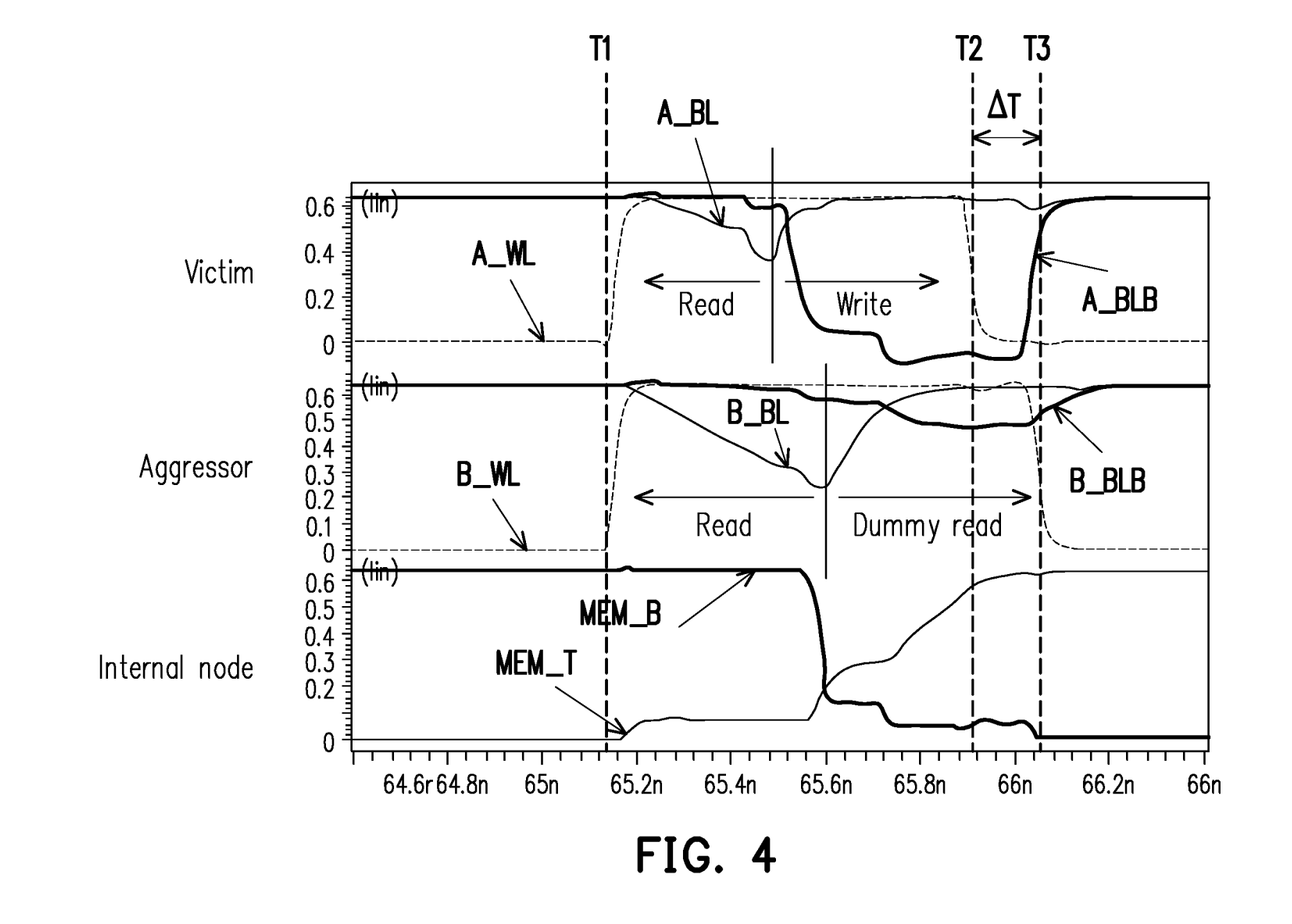
FIG. 4 illustrates a waveform diagram of signals applied for testing according to an embodiment of the present disclosure.
Figure 5:
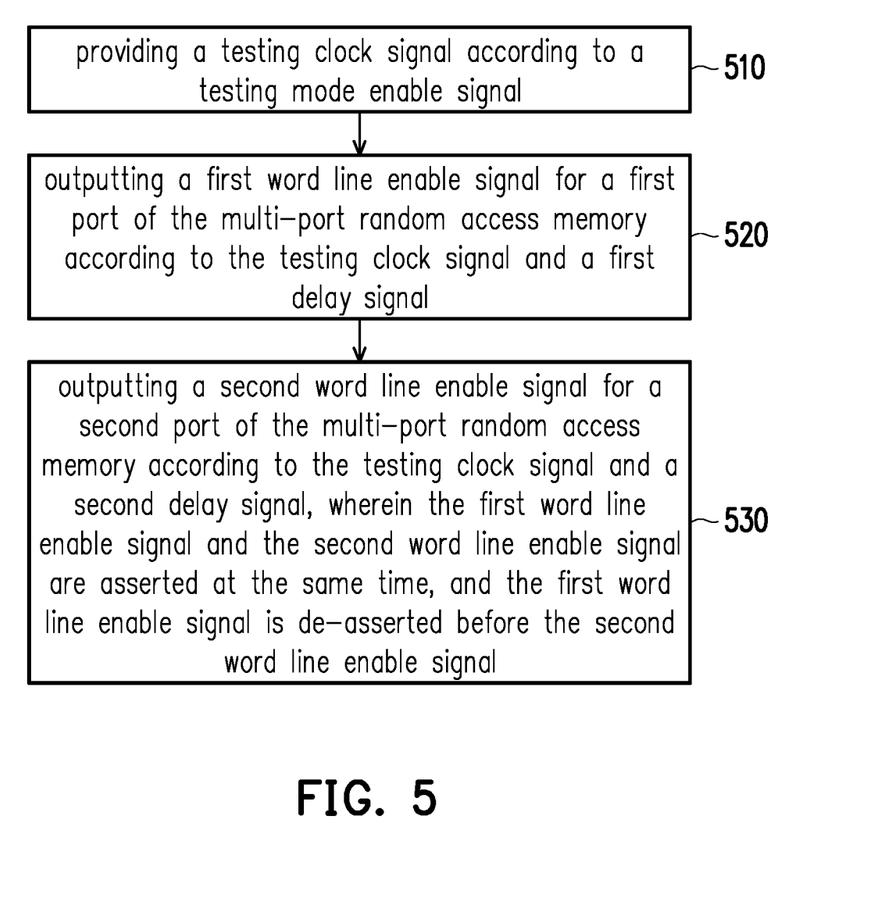
FIG. 5 illustrates a flowchart diagram of a testing method according to an embodiment of the present disclosure.

Referring to FIG. 4, a waveform diagram of signals applied for memory cells of the victim port and memory cells of the aggressor port in an embodiment of the present disclosure is illustrated. The victim port (e.g., port A) is configured to perform the write operation in the read-first mode; and the aggressor port (e.g., port B) is configured to perform the read operation.

As shown in FIG. 4, the write operation in the victim port includes a first reading period and a first write period (read and then write in the read-first mode), where the first reading period is performed before the first write period. The read operation in the aggressor port includes a second read period and a dummy read period, where the second read period is performed before the dummy read period.

In an embodiment of the present disclosure, the block RAM may be the SRAM, in which each of the memory cell in the first port (port A) of the SRAM is coupled to bit lines to receive the corresponding bit line signals A_BL and A_BLB, and each of the memory in the second port (port B) of the SRAM is coupled to the bit lines to receive the corresponding bit line signals B_BL and B_BLB. The values of the signals A_BL, A_BLB, B_BL and B_BLB are set based on the operation performed on the memory cell. The signals MEM_B and MEM_T may indicate the value stored in the memory cell.

In the worst case of the write operation in the read-first mode, the write period in the victim port is fully covered by the read period in the aggressor port. Meanwhile, the memory cells which are written by the victim port are the same as the memory cells which are read by the aggressor port. To emulate the worst case of the write operation, the word line enable signal A_WL for the memory cells written by the victim port and the word line enable signal B_WL for the memory read by the aggressor port are asserted at the same time; and the word line enable signal A_WL falls before the word line enable signal B_WL. As shown in FIG. 4, the word line enable signals A_WL and B_WL are asserted at the same time point T1. The word line enable signal A_WL falls from the high logic level to the low logic level at time point T2; and the word line enable signal B_WL fall from the high logic level to the low logic level at time point T3. The time point T2 is prior to the time point T3 by a period of ΔT. In other words, the word line enable signals A_WL and B_WL are activated at the same time, and the word line enable signal A_WL is deactivated before the word line enable signal B_WL.

Accordingly, the write period in the victim port (port A) is fully covered by the read period in the aggressor port (port B) of the multi-port RAM. In this way, the worst case for the write operation in the read-first mode is emulated without clock skew consideration. As a result, the test time is reduced. In addition, in some embodiments of the present disclosure, a clock signal of a normal mode instead of a dedicated testing clock signal is be used in the test mode, thereby reducing the pin number of the testing circuit.

In accordance with some embodiments of the disclosure, a testing circuit for testing a multi-port random access memory includes an input circuit, a first port testing circuit and a second port testing circuit. The input circuit receives a testing clock signal and a test mode enable signal and is configured to provide the testing clock signal according to the test mode enable signal. The first port testing circuit is coupled to the input circuit, and is configured to output a first word line enable signal for a first port of the multi-port random access memory according to the testing clock signal and a first delay signal. The second port testing circuit is coupled to the input circuit, and is configured to output a second word line enable signal for a second port of the multi-port random access memory according to the testing clock signal and a second delay signal. The first word line enable signal and the second word line enable signal are asserted at the same time, and the first word line enable signal is de-asserted before the second word line enable signal.

In accordance with some embodiments of the disclosure, a method adapted for a testing circuit to test a multi-port random access memory is introduced. The method includes steps of providing a testing clock signal according to a testing mode enable signal; outputting a first word line enable signal for a first port of the multi-port random access memory according to the testing clock signal and a first delay signal; and outputting a second word line enable signal for a second port of the multi-port random access memory according to the clock signal and a second delay signal, wherein the first word line enable signal and the second word line enable signal are asserted at the same time, and the first word line enable signal is de-asserted before the second word line enable signal.

In accordance with some embodiments of the disclosure, an apparatus comprising a device under test and a testing circuit is introduced. The device under test include a multi-port random access memory having a first port and a second port. The testing circuit is coupled to the device under test and includes an input circuit, a first port testing circuit and a second port testing circuit. The input circuit receives a testing clock signal and a test mode enable signal and is configured to provide the testing clock signal according to the test mode enable signal. The first port testing circuit is coupled to the input circuit, and is configured to output a first word line enable signal for a first port of the multi-port random access memory according to the testing clock signal and a first delay signal. The second port testing circuit is coupled to the input circuit, and is configured to output a second word line enable signal for a second port of the multi-port random access memory according to the testing clock signal and a second delay signal. The first word line enable signal and the second word line enable signal are asserted at the same time, and the first word line enable signal is de-asserted before the second word line enable signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing circuit for testing a multi-port random access memory, comprising:
    an input circuit, receiving a testing clock signal and a testing mode enable signal, and providing the testing clock signal according to the testing mode enable signal;
    a first port testing circuit, coupled to the input circuit, outputting a first word line enable signal for a first port of the multi-port random access memory according to the testing clock signal and a first delay signal; and
    a second port testing circuit, coupled to the input circuit, outputting a second word line enable signal for a second port of the multi-port random access memory according to the testing clock signal and a second delay signal,
    wherein the first word line enable signal is configured to activate a write operation in a first-read mode of the multi-port random access memory, the second word line enable signal is configured to activate a read operation in the first-read mode of the multi-port random access memory, the first word line enable signal and the second word line enable signal are asserted at the same time, and the first word line enable signal is de-asserted before the second word line enable signal.

2. The testing circuit of claim 1, wherein
    the first port of the multi-port random access memory is configured to perform the write operation,
    the second port of the multi-port random access memory is configured to perform the read operation,
    the write operation and the read operation are activated at the same time, and
    the write operation is completed before the read operation.

3. The testing circuit of claim 2, wherein
    the write operation comprises a first read operation and a first write operation, the first read operation is performed before the first write operation, and
    the read operation comprises a second read operation and a dummy read operation, the second read operation is performed before the dummy read operation.

4. The testing circuit of claim 2, wherein
    the first port is a victim port and the second port is an aggressor port,
    the write operation in the victim port is disturbs by the read operation in the aggressor port,
    the first word line enable signal is applied to memory cells of the victim port, and
    the second word line enable signal is applied to memory cells of the aggressor port.

5. The testing circuit of claim 1, wherein the testing clock signal is dedicated for a test mode, and the testing clock signal is different from clock signals applied for the first port and the second port of the multi-port random access memory in a normal mode.

6. The testing circuit of claim 1, wherein the testing clock signal is the same as one of clock signals applied for the first port and the second port of the multi-port random access memory in a normal mode.

7. The testing circuit of claim 1, wherein the input circuit comprises:
    a first input terminal, receiving the testing clock signal;
    a second input terminal, receiving the test mode enable signal; and
    a plurality of logic circuits, coupled to the first input terminal and the second input terminal, and configured to output the testing clock signal to the first port testing circuit and the second port testing circuit according to the test mode enable signal.

8. The testing circuit of claim 1, wherein the first port testing circuit comprises:
    a first output terminal, outputting the first word line enable signal to the first port;
    a second output terminal, outputting a first sense amplifier enable signal to the first port; and
    a delay circuit, coupled between the first output terminal and the second output terminal, configured to delay a de-assertion of the first word line enable signal for a pre-determined period according to the first delay signal.

9. The testing circuit of claim 8, wherein the delay circuit comprises:
    delay line elements, coupled to the first output terminal, and configured to delay the de-assertion of the first word line enable signal for the pre-determined period; and
    a logic circuit, coupled to the delay line elements, performing a logic operation to output a delayed first word line enable signal according to the first delay signal.

10. The testing circuit of claim 1, wherein the second port testing circuit comprises:
   a first output terminal, outputting the second word line enable signal to the second port;
   a second output terminal, outputting a second sense amplifier enable signal to the second port; and
   a delay circuit, coupled between the first output terminal and the second output terminal, configured to delay a de-assertion of the second word line enable signal for a pre-determined period according to the second delay signal.

11. The testing circuit of claim 10, wherein the delay circuit comprises:
   delay line elements, coupled to the first output terminal, and configured to delay the de-assertion of the first word line enable signal for the pre-determined period; and
   a logic circuit, coupled to the delay line elements, performing a logic operation to output a delayed second word line enable signal according to the second delay signal.

12. The testing circuit of claim 10, wherein the first delay signal is an inverted signal of the second delay signal.

13. A method adapted for a testing circuit to test a multi-port random access memory, comprising:
   providing a testing clock signal according to a testing mode enable signal;
   outputting a first word line enable signal for a first port of the multi-port random access memory according to the testing clock signal and a first delay signal; and
   outputting a second word line enable signal for a second port of the multi-port random access memory according to the clock signal and a second delay signal,
   wherein the first word line enable signal is configured to activate a write operation in a first-read mode of the multi-port random access memory, the second word line enable signal is configured to activate a read operation in the first-read mode of the multi-port random access memory, the first word line enable signal and the second word line enable signal are asserted at the same time, and the first word line enable signal is de-asserted before the second word line enable signal.

14. The method of claim 13, further comprising:
   performing the write operation in the first port of the multi-port random access memory, and
   performing the read operation on the second port of the multi-port random access memory,
   the write operation and the read operation are activated at the same time, and
   the write operation is completed before the read operation.

15. The method of claim 14, wherein
   performing the write operation in the first port comprises performing a first read operation and performing a first write operation, wherein the first read operation is performed before the first write operation, and
   performing the read operation comprises performing a second read operation and performing a dummy read operation, wherein the second read operation is performed before the dummy read operation.

16. The testing circuit of claim 13, wherein the testing clock signal is dedicated for a test mode, and the testing clock signal is different from clock signals applied for the first port and the second port of the multi-port random access memory in a normal mode.

17. The testing circuit of claim 13, wherein the testing clock signal is the same as one of clock signals applied for the first port and the second port of the multi-port random access memory in a normal mode.

18. The testing circuit of claim 13, wherein providing the testing clock signal according to the testing mode enable signal comprises:
   receiving the testing clock signal;
   receiving the test mode enable signal; and
   outputting the testing clock signal to the first port testing circuit and the second port testing circuit according to the test mode enable signal.

19. The testing circuit of claim 13, further comprising:
   delaying a de-assertion of one of the first word line enable signal and the second word line enable signal for a pre-determined period.

20. An apparatus, comprising:
   a device under test, comprising a multi-port random access memory having a first port and a second port;
   a testing circuit, coupled to the device under test, comprising:
      an input circuit, receiving a testing clock signal and a testing mode enable signal, and providing the testing clock signal according to the testing mode enable signal;
   a first port testing circuit, coupled to the input circuit, outputting a first word line enable signal for a first port of the multi-port random access memory according to the testing clock signal and a first delay signal; and
   a second port testing circuit, coupled to the input circuit, outputting a second word line enable signal for a second port of the multi-port random access memory according to the testing clock signal and a second delay signal,
   wherein the first word line enable signal is configured to activate a write operation in a first-read mode of the multi-port random access memory, the second word line enable signal is configured to activate a read operation in the first-read mode of the multi-port random access memory, the first word line enable signal and the second word line enable signal are asserted at the same time, and the first word line enable signal is de-asserted before the second word line enable signal.

* * * * *